(12) United States Patent
Guo et al.

(10) Patent No.: US 8,946,853 B2
(45) Date of Patent: Feb. 3, 2015

(54) DIFFUSION SIDEWALL FOR A SEMICONDUCTOR STRUCTURE

(75) Inventors: Dechao Guo, Hopewell Junction, NY (US); Shu-Jen Han, Yorktown Heights, NY (US); Chung-Hsun Lin, Yorktown Heights, NY (US); Ning Su, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 399 days.

(21) Appl. No.: 13/351,041

(22) Filed: Jan. 16, 2012

(65) Prior Publication Data

US 2012/0112310 A1    May 10, 2012

Related U.S. Application Data

(62) Division of application No. 12/621,216, filed on Nov. 18, 2009, now Pat. No. 8,105,893.

(51) Int. Cl.
| | |
|---|---|
| *H01L 29/06* | (2006.01) |
| *H01L 21/762* | (2006.01) |
| *H01L 21/84* | (2006.01) |
| *H01L 27/12* | (2006.01) |

(52) U.S. Cl.
CPC .... *H01L 21/76224* (2013.01); *H01L 21/76283* (2013.01); *H01L 21/84* (2013.01); *H01L 27/1203* (2013.01)
USPC ...................... 257/506; 257/351; 257/E29.02

(58) Field of Classification Search
USPC ..................... 257/506, 351, E29.02
See application file for complete search history.

(56) References Cited

U.S. PATENT DOCUMENTS

| | | | |
|---|---|---|---|
| 4,676,847 A | 6/1987 | Lin | |
| 4,926,233 A * | 5/1990 | Hutter | ........................ 257/370 |
| 5,250,837 A | 10/1993 | Sparks | |
| 5,521,422 A | 5/1996 | Mandelman et al. | |
| 5,981,356 A | 11/1999 | Hsuch et al. | |
| 5,994,202 A | 11/1999 | Gambino et al. | |
| 6,084,276 A | 7/2000 | Gambino et al. | |
| 6,097,069 A | 8/2000 | Brown et al. | |
| 6,207,513 B1 | 3/2001 | Vollrath | |
| 6,998,666 B2 | 2/2006 | Beintner et al. | |

(Continued)

OTHER PUBLICATIONS

International Search Report; International Application No. PCT/EP2010/065202; International Filing Date: Oct. 11, 2010; Date of Mailing: Mar. 1, 2011.

(Continued)

*Primary Examiner* — Long Pham
(74) *Attorney, Agent, or Firm* — Cantor Colburn LLP; Vazken Alexanian

(57) ABSTRACT

A method of forming diffusion sidewalls in a semiconductor structure and a semiconductor structure having diffusion sidewalls includes etching a trench into a semiconductor substrate to form first and second active regions, lining each trench with an oxide liner along exposed sidewalls of an active silicon region (RX) of the first and second active regions, removing the oxide liner formed along the exposed sidewalls of the RX region of one of the first and second active regions, forming diffusion sidewalls by epitaxially growing in-situ doped material within the exposed sidewalls of the RX region of the one of the first and second active regions, and forming an isolation region within the trench between the first and second active regions to electrically isolate the first and second active regions from each other.

6 Claims, 2 Drawing Sheets

(56) References Cited

U.S. PATENT DOCUMENTS

| | | |
|---|---|---|
| 2006/0022270 A1 | 2/2006 | Boyd et al. |
| 2006/0076628 A1 | 4/2006 | Anderson et al. |
| 2008/0210980 A1 | 9/2008 | Disney et al. |

OTHER PUBLICATIONS

International Search Report—Written Opinion; International Application No. PCT/EP2010/065202; International Filing Date: Oct. 11, 2010; Date of Mailing: Mar. 1, 2011.

* cited by examiner

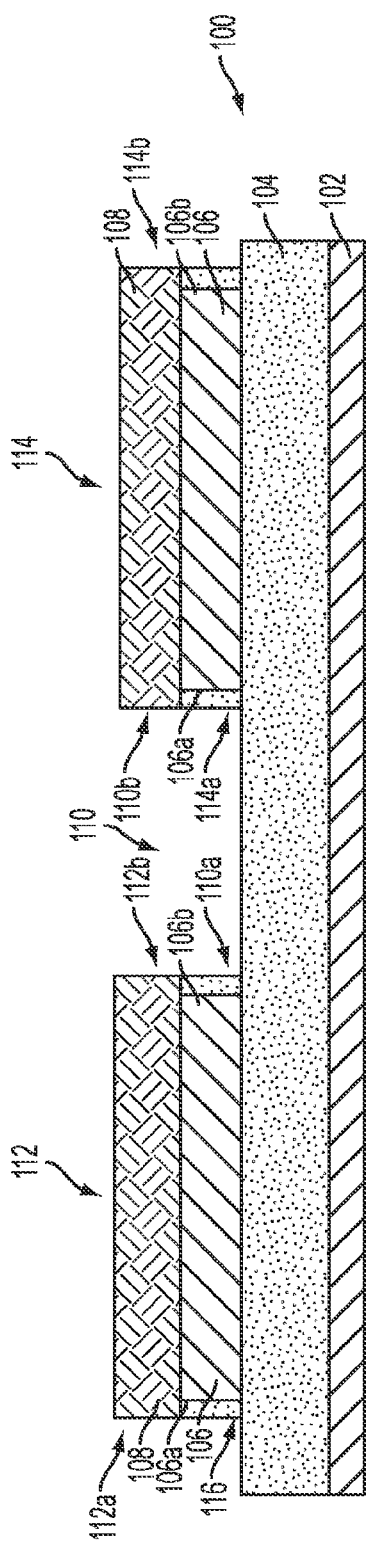
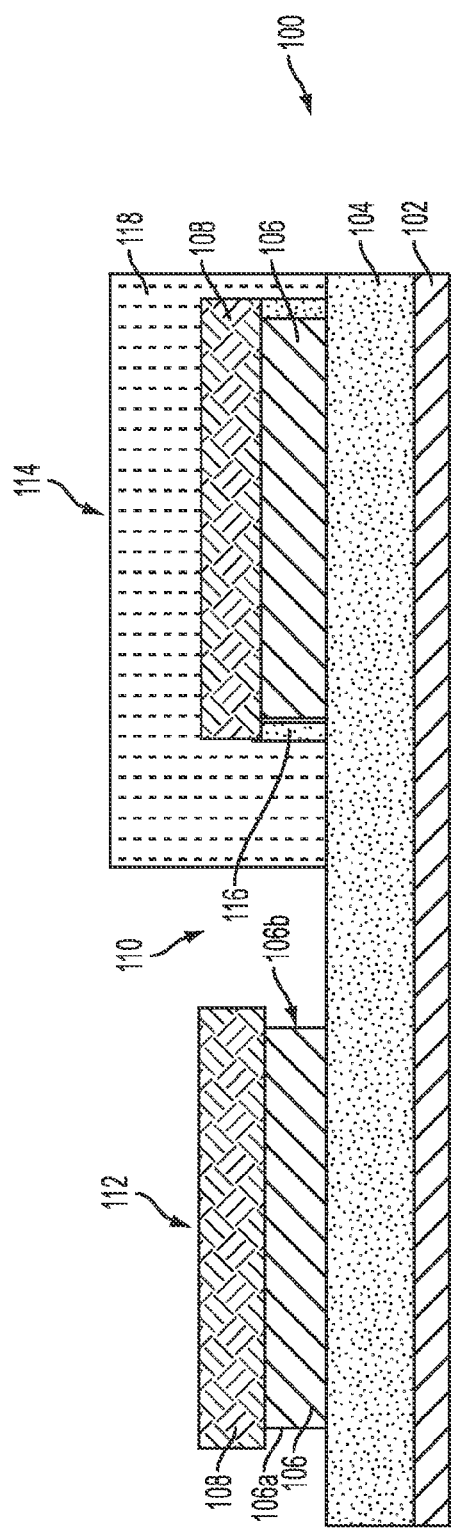

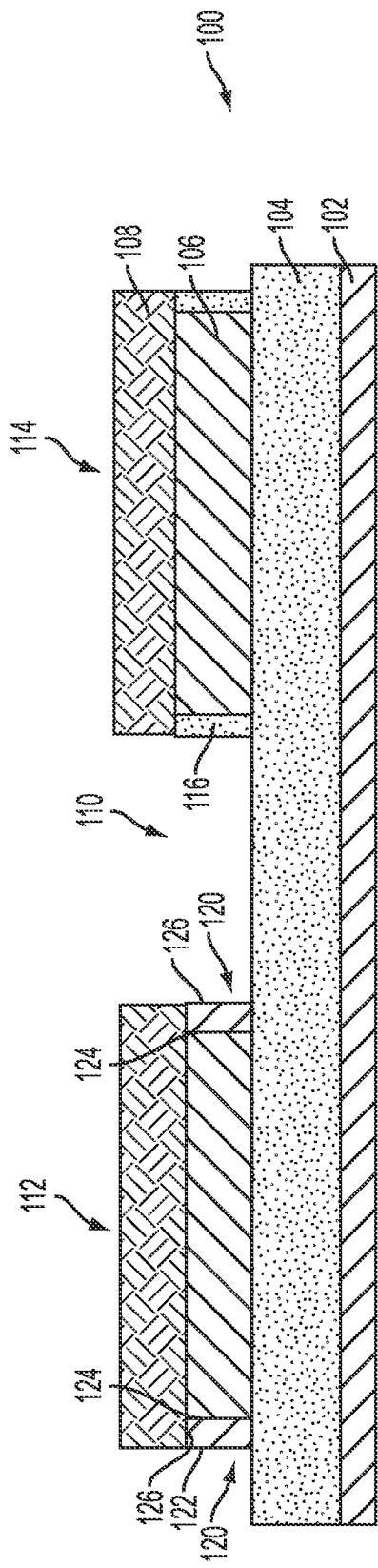
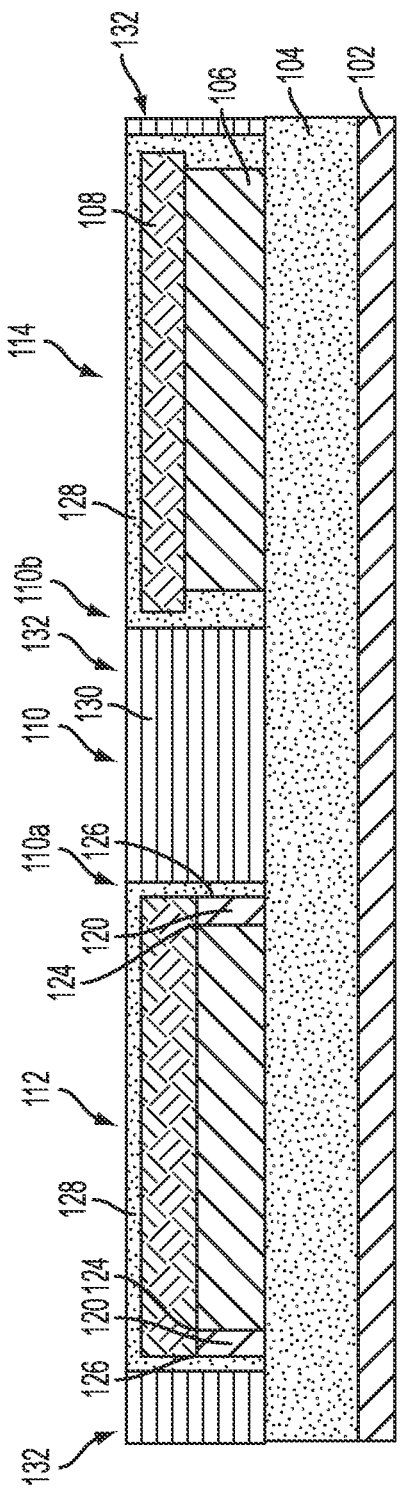
FIG. 3
FIG. 4

DIFFUSION SIDEWALL FOR A SEMICONDUCTOR STRUCTURE

CROSS-REFERENCE TO RELATED APPLICATION

This application is a divisional of U.S. patent application Ser. No. 12/621,216, filed Nov. 18, 2009, now U.S. Pat. No. 8,105,893, the disclosure of which is incorporated by reference herein in its entirety.

BACKGROUND

The present invention relates to semiconductor structures, and more specifically, to a diffusion sidewall to compensate for dopant segregation in silicon-on-insulator (SOI) metal-oxide-semiconductor field effect transistors (MOSFETs).

CMOS technologies employ field effect transistors (FETs) that are adjacent or bounded by trenches. The trenches provide isolation (shallow trench isolation or STI) or they may provide a location for other semiconductor devices. Parasitic leakage paths have been found because of the proximity of a semiconductor device to an edge or corner of each trench. Further, semiconductor devices near the active silicon region (RX)/STI interface (e.g., the corner region) shows a lower threshold voltage (Vt), due to the dopant loss because of the dopant segregation at the RX/STI interface, than at the planar portion of the device.

SUMMARY

The present invention provides a diffusion sidewall of a semiconductor structure formed of an in-situ doped material epitaxially grown at the sidewalls of RX/STI interface to compensate for the dopant depletion.

According to one embodiment of the present invention, a method of forming diffusion sidewalls in a semiconductor structure is provided. The method includes etching a trench into a semiconductor substrate to form first and second active regions, lining each trench with an oxide liner along exposed sidewalls of an active silicon region (RX) of the first and second active regions, removing the oxide liner formed along the exposed sidewalls of the RX region of one of the first and second active regions, forming diffusion sidewalls by epitaxially growing in-situ doped material within the exposed sidewalls of the RX region of the one of the first and second active regions, and forming an isolation region within the trench between the first and second active regions to electrically isolate the first and second active regions from each other.

According to another embodiment of the present invention, a method of forming diffusion sidewalls in a semiconductor structure is provided. The method includes forming an silicon-on-insulator (SOI) substrate, forming a pad nitride layer over SOI substrate, etching a trench to an insulator layer of the SOI substrate to form active regions, forming an oxide liner on exposed sidewalls of an SOI layer of the SOI substrate, removing the oxide liner formed along exposed sidewalls of the SOI layer of one of the active regions, forming an epitaxial layer of in-situ doped material within the sidewalls of the SOI layer of the one of the active regions, and forming an isolation region within the trench to electrically isolate the active regions from each other.

According to yet another embodiment of the present invention, a semiconductor structure is provided. The semiconductor structure includes a plurality of active regions, an isolation region separating the active regions; and a diffusion sidewall formed of in-situ doped epitaxial grown material, the diffusion sidewall formed at an interface between one of the active regions and the isolation region.

According to yet another embodiment of the present invention, a semiconductor structure is provided. The semiconductor structure includes a silicon-on-insulator (SOI) substrate, first and second active regions formed of semiconductor material, a shallow trench isolation region separating the first and second active regions; and diffusion sidewalls formed of in-situ doped epitaxial growth material, the diffusion sidewalls are formed along sidewalls of an SOI layer formed at one of the first and second active regions and interfacing with the isolation region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 is a diagram illustrating a silicon-on-insulator substrate of a semiconductor structure that can be implemented within embodiments of the present invention.

FIG. 2 is a diagram illustrating an etching operation for forming diffusion sidewalls of a semiconductor structure that can be implemented within embodiments of the present invention.

FIG. 3 is a diagram illustrating an epitaxial growth operation of in-situ doped material for forming a plurality of diffusion sidewalls that can be implemented within embodiments of the present invention.

FIG. 4 is a diagram illustrating a semiconductor structure having diffusion sidewalls that can be implemented within embodiments of the present invention.

DETAILED DESCRIPTION

FIG. 1 is a diagram illustrating a silicon-on-insulator (SOI) wafer 100 that can be formed by a variety of conventional methods such as separation by implantation of oxygen (SIMOX) or wafer bonding and etch back. According to one embodiment of the present invention, the wafer 100 includes a silicon substrate or other semiconductor substrate 102, a buried oxide (BOX) layer 104, and a silicon-on-insulator (SOI) layer 106, for example. The present invention is not limited to SOI technology and may also be applied to bulk (non-SOI) CMOS technologies. A pad nitride layer 108 is formed over the SOI layer 106. An optional pad oxide layer (not shown) may be provided as a buffer between the pad nitride layer 108 and the SOI layer 106. According to an embodiment of the present invention, the pad nitride layer 108 may be formed of silicon nitride ($Si_3N_4$) and at a predetermined thickness ranging from approximately 50 to approximately 200 Å.

A plurality of trenches 110 may be formed by patterning a photo resist layer (not shown) on the pad nitride layer 108 and etching down to the BOX layer 104. The etching operation may be a wet etch operation or a timed etch operation, for example. For the purpose of illustration only, a single trench 110 can be seen in FIG. 1. The trench 110 separates two active regions, a first active region 112 and a second active region 114. According to an embodiment of the present invention, the sidewalls 110a and 110b of the trench 110 may be cleaned to reduce the amount of oxide along exposed sidewalls 112a, 112b and 114a and 114b of the first and second active regions 112 and 114, respectively. Afterwards, oxide is grown within the trenches 110 to form an oxide liner 116 at exposed sidewalls 106a and 106b of the SOI layer 106 within the first and second active regions 112 and 114. The trench 110 is used for forming an isolation region (e.g., shallow trench isolation (STI) region) (as depicted in FIG. 4) to electrically isolate the first active region 112 from the second active region 114.

According to an embodiment of the present invention, the first and second active regions 112 and 114 may include semiconductor devices such as metal-oxide-semiconductor field effect transistors (MOSFET) devices. According to one embodiment, the first active region 112 may include an n-type field effect transistor (NFET) device and the second active region 114 may include a p-type field effect transistor (PFET) device.

FIG. 2 is a diagram illustrating an etching operation for forming diffusion sidewalls of the semiconductor structure that can be implemented within embodiments of the present invention. As shown in FIG. 2, a photo resist layer 118 is patterned on the pad nitride layer 108 of the second active region 114 and the oxide liner 116 formed along sidewalls 106a and 106b of the SOI layer 106 (i.e., the active silicon region (RX)) of the first active region 112 is removed in order to form diffusion sidewalls to compensate for dopant segregation within a semiconductor structure (as depicted in FIG. 4). The formation of the diffusion sidewalls will now be discussed with reference to FIG. 3.

FIG. 3 is a diagram illustrating an epitaxial growth operation of in-situ doped material for forming a plurality of diffusion sidewalls that can be implemented within embodiments of the present invention. As shown in FIG. 3, a plurality of diffusion sidewalls 120 are formed along the exposed sidewalls 106a and 106b of the SOI layer 106 of the first active region 114. The diffusion sidewalls 120 are formed vertically along the sidewalls 106a and 106b of the SOI layer 106, however, the present invention is not limited hereto. The diffusion sidewalls 120 are epitaxial layers of in-situ doped material 122 which is epitaxially grown on the sidewalls 106a and 106b, at an interface between the RX region and the isolation region 130 (as depicted in FIG. 4). According to an embodiment of the present invention, the in-situ doped material 122 may include boron (B) doped silicon (Si) or silicon germanium (SiGe), however the present invention is not limited hereto. According to another embodiment of the present invention, the in-situ doped material 122 may include in-situ boron, carbon (C) doped silicon or silicon germanium. The carbon doping confines high boron concentrations near the interface 126 (i.e., the corner region) between the diffusion sidewall 120 and the isolation region 130. According to an embodiment of the present invention, the diffusion sidewalls 120 are formed of a lower boron concentration at an interface 124 with the sidewall 106b of the SOI layer 106 of the first active region 112 than at an interface 126 with an isolation region 130. That is, the in-situ boron dopant profile may be tailored to grade the epitaxial layer for lower boron concentration towards the silicon interface and higher concentration towards the isolation region. According to the present invention, the diffusion sidewalls 120 are of a predetermined thickness ranging from approximately 50 to approximately 200 Å. Further, in FIG. 3, the photo resist layer 118 is removed from the second active region 114.

FIG. 4 is a diagram illustrating a semiconductor structure 200 having diffusion sidewalls that can be implemented within embodiments of the present invention. As shown in FIG. 4, an oxide liner ("STI liner") 128 is formed along sidewalls 110a and 110b of the trench 110 for preparation of forming isolation regions. Specifically, the STI liner 128 is formed adjacent to the diffusion sidewalls 120 of the first active region 112, along the oxide liner 116 remaining on the sidewalls 106a and 106b of the SOI layer 106 of the second active region 114 and along an upper surface of the pad nitride layer 108 of the first and second active regions 112, 114. An insulating material 132 of tetraethyl orthosilicate (TEOS) or silicon dioxide (commonly referred to as "oxide") is deposited within the trench 110. The insulating material 132 may be deposited using a lower pressure chemical vapor deposition (LPCVD) or using high-density plasma CVD oxide or ozone TEOS. An optional high temperature anneal may also be performed to densify the oxide. Once the trench 110 is filled, the insulating material 132 is planarized by a chemical mechanical polishing (CMP) procedure, for example, to form a shallow trench isolation (STI) region 132. As mentioned above, the STI region 132 electrically isolates the first and second active regions 112 and 114 from each other. According to an embodiment of the present invention, after CMP, the STI isolation region 132 is about the same height as the active regions 112 and 114. Both the pad nitride layer 108 and the liner 128 ("post CMP residual oxide") formed over the pad nitride layer 108 will be removed.

Conventional semiconductor fabrication operations are then performed to form a variety of devices such as MOSFET devices within the first and second active regions 112 and 114 on the SOI wafer 100. For example, the pad nitride layer 108 may be stripped off and well implantations may occur to form source and drain regions over which a gate structure may be constructed.

Embodiments of the present invention provide diffusion sidewall structures formed by employing in-situ doping during epilayer growth therefore providing more flexibility in tailoring the doping profile. Further, the SiGe epitaxial layer is favorable as boron (B) diffusion is minimized within SiGe. Further, the present invention is compatible with carbon (C) to further impede boron diffusion. In addition, the use of in-situ doped epi layer may bring the initial doping large enough so that the required dopant level may be achieved even after significant dopant loss.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor structure comprising:
   a plurality of semiconductor devices formed within active regions;
   an isolation region separating the active regions; and
   a diffusion sidewall formed of in-situ doped epitaxial grown material, the diffusion sidewall formed at an interface between one of the active regions and the isolation region;
   wherein the in-situ doped material comprises one of:
     boron (B) doped silicon (Si);
     boron (B) doped silicon germanium (SiGe);
     boron (B), carbon (C) doped silicon (Si); and
     boron (B), carbon (C) doped silicon germanium (SiGe).

2. A semiconductor structure comprising:
   a plurality of semiconductor devices formed within active regions;
   an isolation region separating the active regions; and
   a diffusion sidewall formed of in-situ doped epitaxial grown material, the diffusion sidewall formed at an interface between one of the active regions and the isolation region;
   wherein the in-situ doped material comprises boron (B) doped or boron (B), carbon (C) doped silicon (Si) or silicon germanium (SiGe), wherein a lower boron concentration is formed towards an interface of the active region than towards an interface of the isolation region.

3. The semiconductor structure of claim 1, wherein the one of the active regions comprises a n-type field effect transistor (NFET) device.

4. The semiconductor structure of claim 1, wherein diffusion walls are vertically aligned along the sidewalls of the one of the active region.

5. The semiconductor structure of claim 4, wherein the diffusion sidewalls are of a predetermined thickness ranging from approximately 50 to approximately 200 Å.

6. A semiconductor structure comprising:
   a silicon-on-insulator (SOI) substrate;
   first and second active regions formed of semiconductor material;
   a shallow trench isolation region separating the first and second active regions; and
   diffusion sidewalls formed of in-situ doped epitaxial grown material, the diffusion sidewalls are formed along sidewalls of an SOI layer formed at one of the first and second active regions and interfacing with the isolation region.

* * * * *